(12) United States Patent
Kim

(10) Patent No.: US 8,405,077 B2
(45) Date of Patent: Mar. 26, 2013

(54) MAGNETIC MEMORY DEVICES

(75) Inventor: Ki Joon Kim, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 181 days.

(21) Appl. No.: 13/070,890

(22) Filed: Mar. 24, 2011

(65) Prior Publication Data
US 2011/0233698 A1  Sep. 29, 2011

(30) Foreign Application Priority Data
Mar. 29, 2010  (KR) ............. 10-2010-0028011

(51) Int. Cl.
*H01L 29/10*  (2006.01)
(52) U.S. Cl. ..... 257/43; 257/421; 257/16; 257/E29.323; 365/157
(58) Field of Classification Search ............. 257/16, 257/43, 421, E29.323; 365/158
See application file for complete search history.

(56) References Cited

FOREIGN PATENT DOCUMENTS
| | | |
|---|---|---|
| JP | 2009-111396 | 5/2009 |
| JP | 2009-212156 | 9/2009 |
| KR | 1020070049654 A | 5/2007 |
| KR | 1020070106701 A | 11/2007 |

OTHER PUBLICATIONS

S. Ikeda et al. "Tunnel magnetoresistance of 604% at 300 K by suppression of Ta diffusion in CoFeB/MgO/CoFeB pseudo-spin-valves annealed at high temperature" Applied Physics Letters 93, 082508 (2008).
Stuart S. P. Parkin et al. "Giant tunnelling magnetoresistance at room temperature with MgO (100) tunnel barriers" Nature Materials, vol. 3, pp. 862-867, Dec. 2004.

*Primary Examiner* — Eugene Lee
*Assistant Examiner* — Elias M Ullah
(74) *Attorney, Agent, or Firm* — Myers Bigel Sibley & Sajovec, P.A.

(57) ABSTRACT

Provided is a magnetic memory device and a method of forming the same. A first magnetic conductive layer is disposed on a substrate. A first tunnel barrier layer including a first metallic element and a first non-metallic element is disposed on the first magnetic conductive layer. A second magnetic conductive layer is disposed on the first tunnel barrier layer. A content of an isotope of the first metallic element having a non-zero nuclear spin quantum number is lower than a natural state.

17 Claims, 4 Drawing Sheets

MAGNETIC MEMORY DEVICES

CROSS-REFERENCE TO RELATED APPLICATIONS

This U.S. non-provisional patent application claims priority under 35 U.S.C. §119 to Korean Patent Application No. 10-2010-0028011, filed on Mar. 29, 2010, the entire contents of which are hereby incorporated by reference.

BACKGROUND

The present disclosure relates to memory devices and a methods of forming the same, and more particularly, to magnetic memory devices and methods of forming the same.

As high speed and low power consumption electronic devices are realized, memory devices built in the electronic devices also require rapid read/write performance and low operation voltages. Magnetic memory devices are being studied as memory devices that may satisfy these requirements. Because magnetic memory devices have generally high-speed performance and/or non-volatile characteristics, they have drawn attention as a next generation memory.

Commonly known magnetic memory devices may include a magnetic tunnel junction (MTJ). The magnetic tunnel junction is formed by two magnetic substances and an insulation layer interposed therebetween, and the resistance of the magnetic tunnel junction may vary with the magnetization directions of the two magnetic substances. Specifically, when the magnetization directions of the two magnetic substances are anti-parallel to each other, the magnetic tunnel junction may have a relatively high resistance. When the magnetization directions of the two magnetic substances are parallel to each other, the magnetic tunnel junction may have a relatively low resistance. The difference between these resistances may be used to write/read data.

Tunneling magneto resistance (TMR) is calculated from the ratio of the difference between resistances in the anti-parallel state and parallel state to the resistance in the parallel state. Therefore, as the resistance ratio increases, TMR increases.

SUMMARY

The present disclosure provides memory devices having a high tunneling magneto resistance (TMR), and methods of forming the same.

Embodiments of the inventive concept provide a magnetic memory device including: a first magnetic conductive layer on a substrate; a first tunnel barrier layer provided on the first magnetic conductive layer, and including a first metallic element and a first non-metallic element; and a second magnetic conductive layer on the first tunnel barrier layer, wherein a content of an isotope of the first metallic element having a non-zero nuclear spin quantum number is lower than a natural state.

In some embodiments, the first metallic element may comprise magnesium (Mg), titanium (Ti), aluminum (Al), and/or vanadium (V).

In other embodiments, the first metallic element may include magnesium (Mg), and a content of isotope ($^{25}$Mg) of the magnesium may be lower than about 10 at. %.

In still other embodiments, a content of an isotope of the first non-metallic element having a non-zero nuclear spin quantum number may be lower than the natural state.

In even other embodiments, the first non-metallic element comprises oxygen (O), nitrogen (N), and/or carbon (C).

In yet other embodiments, the first non-metallic element may include oxygen, and a content of isotope ($^{17}$O) of the oxygen may be lower than about 0.04 at. %.

In further embodiments, a content of an isotope comprised in the first magnetic conductive layer having a non-zero nuclear spin quantum number may be lower than the natural state.

In still further embodiments, a content of an isotope comprised in the second magnetic conductive layer having a non-zero nuclear spin quantum number may be lower than the natural state.

In even further embodiments, a magnetization direction of the first magnetic conductive layer and a magnetization direction of the second magnetic conductive layer may be substantially parallel to a planar surface of the substrate during operation of the magnetic memory device.

In yet further embodiments, the first magnetic conductive layer may include a pinning layer and a pinned layer.

In much further embodiments, the magnetic memory device may further include a second tunnel barrier layer and a third magnetic conductive layer, which are sequentially stacked on the second magnetic conductive layer.

In still much further embodiments, the second barrier layer may include a second metallic element and a second non-metallic element, wherein a content of an isotope of the second metallic element having a non-zero nuclear spin quantum number is lower than the natural state.

In even much further embodiments, the second metallic element may include magnesium (Mg), and a content of isotope ($^{25}$Mg) of the magnesium may be lower than about 10 at. %.

In yet much further embodiments, a magnetization direction of the first magnetic conductive layer and a magnetization direction of the second magnetic conductive layer may be substantially vertical to a planar surface of the substrate during operation of the magnetic memory device.

In yet much further embodiments, the magnetic memory device may further include: a first junction magnetic layer between the first magnetic conductive layer and the first tunnel barrier layer; and a second junction magnetic layer between the second magnetic conductive layer and the first tunnel barrier layer.

In yet much further embodiments, the first tunnel barrier layer may be crystalline.

In yet much further embodiments, a content of an isotope of the first metallic element having even numbers of both protons and neutrons is higher than the natural state.

In other embodiments of the inventive concept, a method of forming magnetic memory device includes: forming a first magnetic conductive layer on a substrate; forming a tunnel barrier layer on the first magnetic conductive layer that includes a metallic element and a non-metallic element; and forming a second magnetic conductive layer on the tunnel barrier layer, wherein a content of an isotope of the metallic element having a non-zero nuclear spin quantum number of is lower than a natural state.

In some embodiments, the forming of the tunnel barrier layer may decrease isotopes having a non-zero nuclear spin quantum number of the metallic element and/or the non-metallic element in at least one of a thermal diffusion method, an electromagnetic mass separation method, a laser isotope separation method, a centrifugal method, an electrolytic separation method, an isotope exchange reaction method, and a gas diffusion method.

In other embodiments, the tunnel barrier layer may comprise magnesium oxide (MgO).

BRIEF DESCRIPTION OF THE DRAWINGS

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION OF THE EMBODIMENTS

Figure 1:
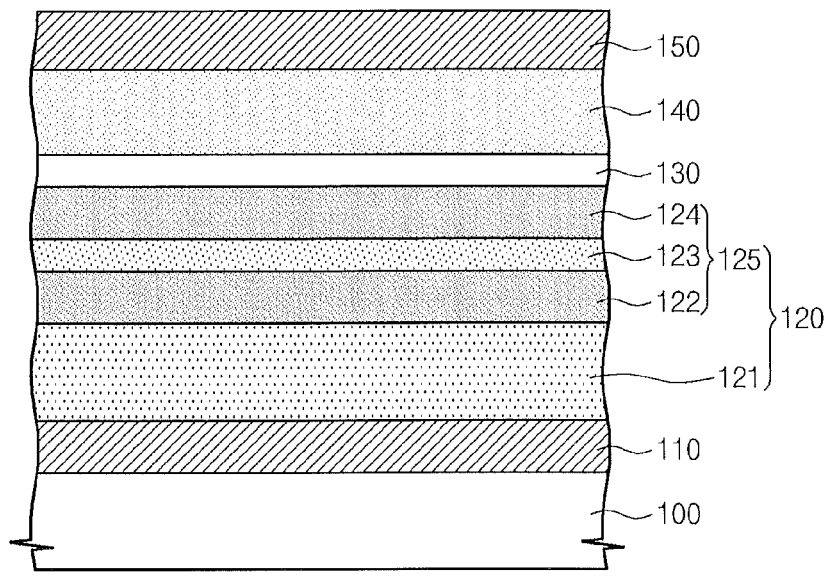
FIG. 1 is a cross-sectional view for describing magnetic memory devices and methods of forming the same according to embodiments of the inventive concept.

Exemplary embodiments of the inventive concept will be described below in more detail with reference to the accompanying drawings. The embodiments of the inventive concept may, however, be embodied in different forms and should not be construed as limited to the embodiments set forth herein. Rather, these embodiments are provided so that this disclosure will be thorough and complete, and will fully convey the scope of the inventive concept to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout this description. As used herein, the term "and/or" includes any and all combinations of one or more of the associated listed items.

It will be understood that, although the terms first, second, third, fourth etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments of the inventive concept only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments of the inventive concept are described herein with reference to cross-sectional illustrations that are schematic illustrations of idealized example embodiments of the inventive concept (and intermediate structures). As such, variations from the shapes of the illustrations as a result, for example, of manufacturing techniques and/or tolerances, are to be expected. Thus, example embodiments of the inventive concept should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

Hereinafter, exemplary embodiments of the inventive concept will be described in detail with reference to the accompanying drawings.

Referring to FIG. 1, a lower electrode layer 110 and a first magnetic conductive layer 120 may be formed on a substrate 100. The substrate 100 may include a conductive region and/or an active region. The substrate 100 may have an arbitrary semiconductor substrate structure having a silicon surface. The semiconductor substrate structure may include, for example, silicon-on-insulator (SOI), silicon germanium (SiGe), germanium (Ge), gallium arsenide (GaAs), and/or a silicon epitaxial layer supported by a semiconductor structure, such as doped or undoped silicon. The lower electrode layer 110 may be electrically connected to the active region of the substrate 100. The lower electrode layer 110 may be formed of a transition metal, a conductive metal nitride, and/or a conductive ternary nitride. The lower electrode layer 110 may be formed through sputtering or plasma-enhanced chemical vapor deposition (PECVD).

The first magnetic conductive layer 120 may include a pinning layer 121 and a pinned layer 125. The pinning layer 121 may include an anti-ferromagnetic material. The pinning layer 121 may include PtMn, IrMn, MnO, MnS, MnTe, $MnF_2$, $FeCl_2$, FeO, $CoCl_2$, CoO, $NiCl_2$, NiO, and/or Cr. In an exemplary embodiment, the pinning layer 121 may include one or more precious metals. The precious metal may comprise ruthenium (Ru), rhodium (Rh), palladium (Pd), osmium (Os), iridium (Ir), platinum (Pt), gold (Au) and/or silver (Ag).

The pinned layer 125 may have a magnetization direction pinned by the pinning layer 121. The pinned layer 125 may include a ferromagnetic material. For instance, the pinned layer 125 may include a first ferromagnetic layer 122, a second ferromagnetic layer 124, and an anti-magnetic layer 123 provided therebetween. The magnetization direction of the first ferromagnetic layer 122 may be pinned by the pinning layer 121. The magnetization direction of the second ferromagnetic layer 124 may be pinned anti-parallel to the magnetization direction of the first ferromagnetic layer 122. The anti-magnetic layer 123 may allow the magnetization directions of the first and second ferromagnetic layers 122 and 124 to be pinned anti-parallel to each other.

The first and second ferromagnetic layers 122 and 124 may include a ferromagnetic material. For example, the first and second ferromagnetic layers 122 and 124 may comprise CoFeB, Fe, Co, Ni, Gd, Dy, CoFe, NiFe, MnAs, MnBi, MnSb, $CrO_2$, $MnOFe_2O_3$, $FeOFe_2O_3$, $NiOFe_2O_3$, $CuOFe_2O_3$, $MgOFe_2O_3$, EuO, and/or $Y_3Fe_5O_{12}$. The anti-magnetic layer 123 may include a precious metal. For example, the anti-magnetic layer 123 may comprise ruthenium (Ru), iridium (Ir), and/or rhodium (Rh).

A tunnel barrier layer 130 may be provided on the first magnetic conductive layer 120. As an electron has a spin, a nucleus may have a spin. In this case, a nucleus has an angular momentum expressed with a spin quantum number (I), and has an allowed spin state determined by a nuclear spin quantum number (I). If the nuclear spin quantum number is I, the number of allowed spin states are 2I+1, of which the allowed spin states are −I, (−I+1), . . . , (I−1), and I. For example, the nuclear spin quantum number of hydrogen (H) is I=½, and thus the number of allowed states are 2, of which spin states are −½ and +½, respectively. That is, when an external magnetic field is applied, the hydrogen nucleus has a magnetic moment, which is parallel or anti-parallel to the magnetic field. When the spin state is +½, the nucleus has a magnetic moment parallel to the external magnetic field, i.e., low energy level. Conversely, when the spin state is −½, the nucleus has a magnetic moment anti-parallel to the external magnetic field, i.e., a high energy level. As the external magnetic field is stronger, an energy difference between the two spin states become greater.

The spin quantum number (I) of the nucleus is determined by the relative numbers of protons and neutrons. If the number of protons or the number of neutrons in the nucleus is odd, nuclear spin quantum number is not 0. Conversely, if the number of protons and the number of neutrons are even, nuclear spin quantum number (I) is 0.

Table 1 below shows the isotopes of magnesium (Mg), which are stable in a natural state.

TABLE 1

| Symbol | Proton Number | Neutron Number | Mass Number | Nuclear spin Quantum Number | Mole Fraction in Natural State (at. %) |
|---|---|---|---|---|---|
| $^{24}$Mg | 12 | 12 | 24 | 0 | 78.99 |
| $^{25}$Mg | 12 | 13 | 25 | 5/2 | 10.00 |
| $^{26}$Mg | 12 | 14 | 26 | 0 | 11.01 |

As listed in table 1, magnesium has about 10 at. % $^{25}$Mg having a nuclear spin quantum number other than 0 in a natural state, as compared to $^{24}$Mg and $^{26}$Mg having a nuclear spin quantum number of 0. The nuclear spin of $^{25}$Mg having a nuclear spin quantum number other than 0 may cause the spin relaxation of electrons passing through a tunnel barrier layer. The spin relaxation may weaken the spin filter function of a magnetic memory device.

Table 2 below shows the isotopes of oxygen (O) that are stable in a natural state.

TABLE 2

| Symbol | Proton Number | Neutron Number | Mass Number | Nuclear spin Quantum Number | Mole Fraction in Natural State (at. %) |
|---|---|---|---|---|---|
| $^{16}$O | 8 | 8 | 16 | 0 | 99.757 |
| $^{17}$O | 8 | 9 | 17 | 5/2 | 0.038 |
| $^{18}$O | 8 | 10 | 18 | 0 | 0.205 |

As listed in table 2, oxygen has $^{17}$O of about 0.04 at. % having a nuclear spin quantum number other than 0 in a natural state, as compared to $^{16}$O and $^{18}$O having a nuclear spin quantum number of 0. $^{17}$O may cause spin relaxation like $^{25}$Mg.

In an exemplary embodiment of the inventive concept, the tunnel barrier layer 130 may include a metallic element and a non-metallic element. In an exemplary embodiment, the metallic element may comprise Mg, titanium (Ti), aluminum (Al), and/or vanadium (V). The non-metallic element may comprise oxygen (O), nitrogen (N), and/or carbon (C). As an example, the tunnel barrier layer 130 may comprise the oxide of Mg, Ti, Al, magnesium-zinc (MgZn), and/or magnesium-boron (MgB), and/or the nitride of Ti and/or V. For example, the tunnel barrier layer 130 may be a magnesium oxide (MgO) layer. In other embodiments, the tunnel barrier layer 130 may include a plurality of layers. For example, the tunnel barrier layer 130 may include Mg/MgO, MgO/Mg, and/or Mg/MgO/Mg. In an exemplary embodiment of the inventive concept, the tunnel barrier layer 130 may have a certain crystal structure. For example, the tunnel barrier layer 130 may have a lattice structure of body-centered cubic (BCC).

The metallic element may be controlled for the content of an isotope having a nuclear spin quantum number other than 0 to become lower than a natural state. In the metallic element, the content of an isotope where the number of protons and the number of neutrons are even in the nucleus may be higher than a natural state. As an example, when the metallic element includes Mg, the content of isotope ($^{25}$Mg) of Mg may be lower than about 10 at. %. Thus, the spin relaxation of electrons passing through a magnetic memory device is moderated, and the on/off resistance ratio of a device can be improved. Accordingly, the tunneling magneto resistance (TMR) of the magnetic memory device can increase.

The non-metallic element may be controlled for the content of an isotope having a nuclear spin quantum number other than 0 to become lower than a natural state. In the non-metallic element, the content of an isotope where the number of protons and the number of neutrons are even in the nucleus may be higher than a natural state. As an example, when the non-metallic element includes O, the content of isotope ($^{17}$O) of O may be lower than about 0.04 at. %.

The tunnel barrier layer 130 may be formed through sputtering, chemical vapor deposition (CVD) or atomic layer deposition (ALD). The isotope control may be performed using the difference of the physical properties of isotopes during the forming of the tunnel barrier layer. As an example, the control of isotopes may be performed in a thermal diffusion method using a thermal velocity difference between the isotopes or an electromagnetic mass separation method based on a magnetic field.

The control of isotopes may be performed when manufacturing a target for the sputtering or forming a precursor for performing the CVD or the ALC. As an example, when forming the target or the precursor, isotopes having a nuclear spin quantum number other than 0 may be removed in a centrifugal method, a laser isotope separation method, an electrolytic separation method, an isotope exchange reaction method, and/or a gas diffusion method.

A second magnetic conductive layer 140 may be provided on the tunnel barrier layer 130. The second magnetic conductive layer 140 may include a material having a changeable magnetization direction. The magnetization direction of the second magnetic conductive layer 140 may be changed by an electric/magnetic factor that is provided from the outside and/or inside of a magnetic memory cell. Based on whether the magnetization direction of the second magnetic conductive layer 140 is parallel to the magnetization direction of the first magnetic conductive layer 120, the magnetic resistance of a magnetic memory cell including the first and second magnetic conductive layers 120 and 140 may be varied. Using this, the data of the magnetic memory cell may be written or read. The second magnetic conductive layer 140 may include a ferromagnetic material. For example, the second magnetic conductive layer 140 may comprise CoFeB, Fe, Co, Ni, Gd, Dy, CoFe, NiFe, MnAs, MnBi, MnSb, $CrO_2$, $MnOFe_2O_3$, $FeOFe_2O_3$, $NiOFe_2O_3$, $CuOFe_2O_3$, $MgOFe_2O_3$, EuO, and/or $Y_3Fe_5O_{12}$.

The second magnetic conductive layer 140 may formed in a plurality of layers. For example, the second magnetic conductive layer 140 may include layers including a plurality of ferromagnetic materials, and a layer including a non-magnetic material disposed between the layers. In this case, the layers including the ferromagnetic materials and the layer including the non-magnetic material may constitute a synthetic anti-ferromagnetic layer. The synthetic anti-ferromagnetic layer can decrease a critical current density of a magnetic memory device and increase thermal stability. The magnetization directions of the first and second magnetic conductive layers 120 and 140 may be substantially parallel to the planar surface of the substrate 100.

An upper electrode layer 150 may be provided on the second magnetic conductive layer 140. The upper electrode layer 150 may be formed of the same material as that of the lower electrode layer 110. A capping layer (not shown) may be further formed between the second magnetic conductive layer 140 and the upper electrode layer 150.

According to an embodiment of the inventive concept, the contents of isotopes having a nuclear spin quantum number other than 0 in the tunnel barrier layer 130 may become lower than a natural state. Accordingly, spin relaxation can be improved.

A magnetic memory device and a method of forming the same according to other embodiments of the inventive concept will be described below with reference to FIG. 2.

For conciseness, description of repetitive technical features will be omitted.

Figure 2:
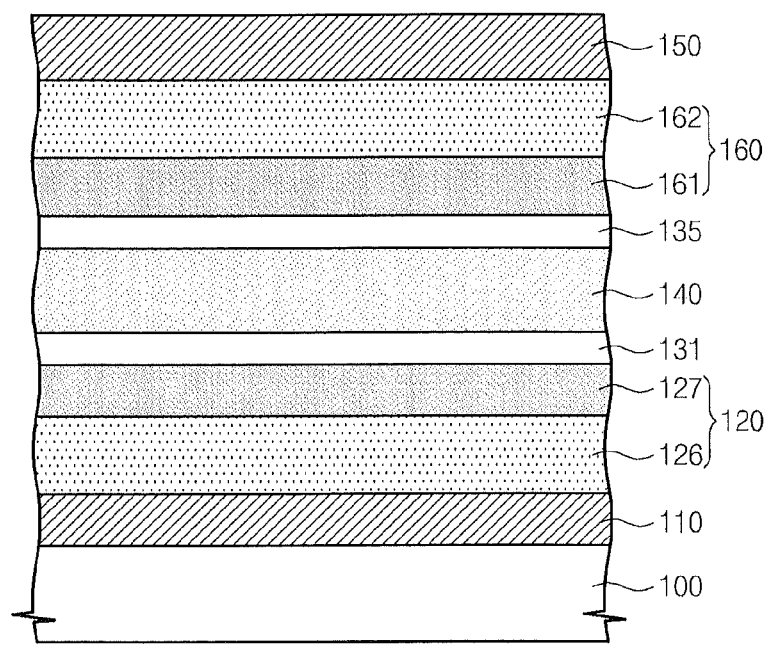
FIG. 2 is a cross-sectional view for describing magnetic memory devices and methods of forming the same according to other embodiments of the inventive concept.

Referring to FIG. 2, the lower electrode layer 110 and the first magnetic conductive layer 120 may be formed on the substrate 100. The first magnetic conductive layer 120 may include a first pinning layer 126 and a first pinned layer 127. The first pinning layer 126 may include an anti-ferromagnetic material. The first pinning layer 126 may comprise PtMn, IrMn, MnO, MnS, MnTe, $MnF_2$, $FeCl_2$, FeO, $CoCl_2$, CoO, $NiCl_2$, NiO, and/or Cr. The first pinned layer 127 may have a magnetization direction, which is pinned by the first pinning layer 126. The first pinned layer 127 may include a ferromagnetic material. In an embodiment of the inventive concept, the first pinned layer 127 may include a single layer including a ferromagnetic material. The first pinned layer 127, for example, may comprise CoFeB, Fe, Co, Ni, Gd, Dy, CoFe, NiFe, MnAs, MnBi, MnSb, $CrO_2$, $MnOFe_2O_3$, $FeOFe_2O_3$, $NiOFe_2O_3$, $CuOFe_2O_3$, $MgOFe_2O_3$, EuO, and/or $Y_3Fe_5O_{12}$.

A first tunnel barrier layer 131 may be provided on the first magnetic conductive layer 120. The first tunnel barrier layer 131 may include a first metallic element and a first non-metallic element. In an embodiment of the inventive concept, the first metallic element may comprise Mg, Ti, Al, and/or V. The first non-metallic element may comprise O, N, and/or C. As an example, the first tunnel barrier layer 131 may comprise an oxide of Mg, Ti, Al, MgZn, and/or MgB, and/or a nitride of Ti and/or V. For example, the first tunnel barrier layer 131 may be an MgO layer. In other embodiments, the first tunnel barrier layer 131 may include a plurality of layers. For example, the first tunnel barrier layer 131 may comprise Mg/MgO, MgO/Mg, and/or Mg/MgO/Mg. In an embodiment of the inventive concept, the first tunnel barrier layer 131 may have a certain crystal structure. For example, the first tunnel barrier layer 131 may have a lattice structure of body-centered cubic (BCC).

The first metallic element may be controlled for the content of an isotope having a nuclear spin quantum number other than 0 to become lower than a natural state. In the first metallic element, the content of isotope where the number of protons and the number of neutrons are even in the nucleus may be higher than a natural state. As an example, when the first metallic element includes Mg, the content of isotope ($^{25}$Mg) of Mg may be lower than about 10 at. %. Thus, the spin relaxation of electrons passing through a magnetic memory device is moderated, and the on/off resistance ratio of a device can be improved. Accordingly, the tunneling magneto resistance (TMR) of the magnetic memory device can increase.

The first non-metallic element may be controlled for the content of isotope having a nuclear spin quantum number other than 0 to become lower than a natural state. In the first non-metallic element, the content of isotope where the number of protons and the number of neutrons are even in the nucleus may be higher than a natural state. As an example, when the first non-metallic element includes O, the content of isotope ($^{17}$O) of O may be lower than about 0.04 at. %.

The first tunnel barrier layer 131 may be formed through sputtering, CVD or ALD. The isotope control may be performed using the difference of the physical properties of isotopes during the deposition of the tunnel barrier layer. As an example, the control of isotopes may be performed in a thermal diffusion method using a thermal velocity difference between the isotopes or an electromagnetic mass separation method based on a magnetic field.

The control of isotopes may be performed when manufacturing a target for the sputtering or forming a precursor for performing the CVD or the ALC. As an example, when forming the target or the precursor, isotopes having a nuclear spin quantum number other than 0 may be reduced in a centrifugal method, a laser isotope separation method, an electrolytic separation method, an isotope exchange reaction method, and/or a gas diffusion method.

The second magnetic conductive layer 140 may be provided on the first tunnel barrier layer 131. The second magnetic conductive layer 140 may include a material having a changeable magnetization direction. The magnetization direction of the second magnetic conductive layer 140 may be changed by an electric/magnetic factor that is provided from the outside and/or inside of a magnetic memory cell. Based on whether the magnetization direction of the second magnetic conductive layer 140 is parallel to the magnetization direction of the first magnetic conductive layer 120 and the magnetization direction of a first magnetic conductive layer that will be described below, the magnetic resistance of a magnetic memory cell including the first and second magnetic conductive layers 120 and 140 and the third magnetic conductive layer may be varied. Using this, the data of the magnetic memory cell may be written or read. The second magnetic conductive layer 140 may include a ferromagnetic material. For example, the second magnetic conductive layer 140 may comprise CoFeB, Fe, Co, Ni, Gd, Dy, CoFe, NiFe, MnAs, MnBi, MnSb, $CrO_2$, $MnOFe_2O_3$, $FeOFe_2O_3$, $NiOFe_2O_3$, $CuOFe_2O_3$, $MgOFe_2O_3$, EuO, and/or $Y_3Fe_5O_{12}$.

A second tunnel barrier layer 135 may be provided on the second magnetic conductive layer 140. The second tunnel barrier layer 135 may include a second metallic element and a second non-metallic element. The second metallic element may be controlled for the content of isotope having a nuclear spin quantum number other than 0 to become lower than a natural state. In the second metallic element, the content of isotope having a nuclear spin quantum number other than 0 may be lower than a natural state. The second tunnel barrier layer 135 may be formed in the same method as that used for forming the first tunnel barrier layer 131.

A third magnetic conductive layer 160 may be provided on the second tunnel barrier layer 135. The third magnetic conductive layer 160 may include a second pinned layer 161 and a second pinning layer 162 that are sequentially stacked on the second tunnel barrier layer 135. The second pinned layer 161 and the second pinning layer 162 may be formed of the same materials as materials that are included in the first pinned layer 127 and the first pinning layer 126, respectively. The magnetic memory device may have a dual magnetic tunnel junction by the first to third magnetic conductive layers 120, 140, and 160. The TMR of the magnetic memory device can increase due to the dual magnetic tunnel junction.

Any one of the first to third magnetic conductive layers 120, 140, and 160 may include an element where the content of isotope having a nuclear spin quantum number other than 0 is lower than a natural state. As an example, the first magnetic conductive layer 120 may include platinum (Pt). Pt includes about 33.8 at. % $^{195}$Pt having a nuclear spin quantum number other than 0 in a natural state. Therefore, by controlling the content of the isotope ($^{195}$Pt) lower than the natural state, spin relaxation can be more moderated.

The upper electrode layer 150 may be provided on the third magnetic conductive layer 160. The upper electrode layer 150 may be formed of the same material as that of the lower electrode layer 110. A capping layer (not shown) may be further formed between the third magnetic conductive layer 160 and the upper electrode layer 150.

According to another embodiment of the inventive concept, the contents of isotopes having a nuclear spin quantum number other than 0 can become lower than a natural state. Accordingly, spin relaxation can be improved.

A magnetic memory device and a method of forming the same according to other embodiments of the inventive concept will be described below with reference to FIG. 3.

For conciseness, description of repetitive technical features will be omitted.

Figure 3:
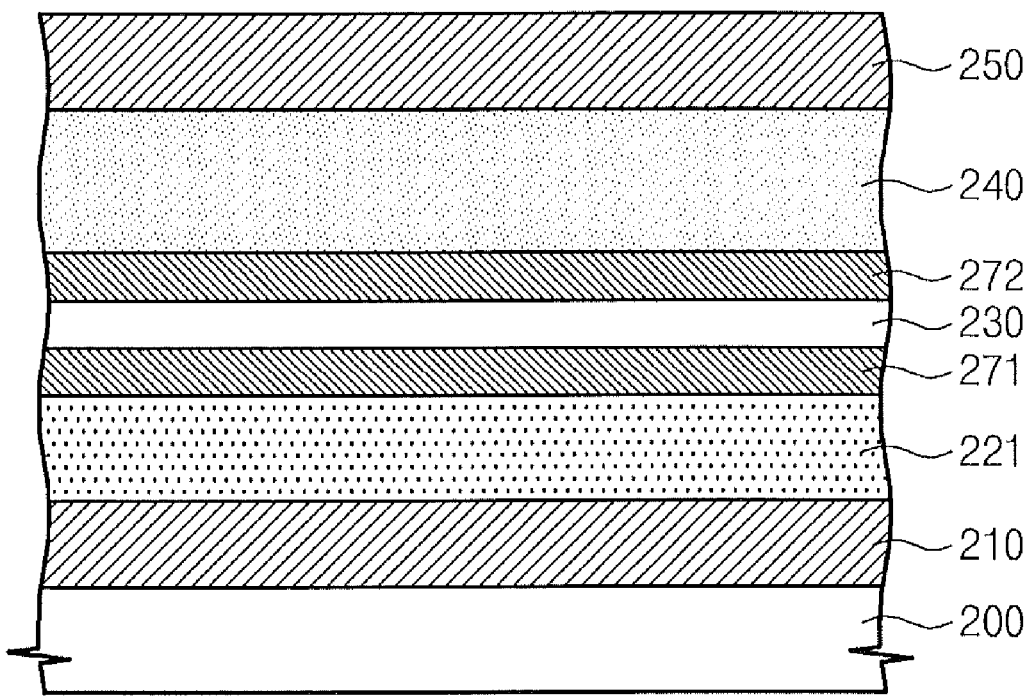
FIG. 3 is a cross-sectional view for describing magnetic memory devices and methods of forming the same according to other embodiments of the inventive concept.

Referring to FIG. 3, a lower electrode layer 210 may be formed on a substrate 200. A first magnetic conductive layer 221 may be formed on the lower electrode layer 210. The first magnetic conductive layer 221 may include a ferromagnetic material. In an embodiment of the inventive concept, the first magnetic conductive layer 221 may comprise iron (Fe), cobalt (Co), nickel (Ni), chromium (Cr), Pt, palladium (Pd), iridium (Ir), ruthenium (Ru), rhodium (Rh), osmium (Os), rhenium (Re), gold (Au), and/or copper (Cu).

A first junction magnetic layer 271 may be provided on the first magnetic conductive layer 221. The first junction magnetic layer 271 may include a soft magnetic material. The first junction magnetic layer 271 may have a low damping constant and a high spin polarization ratio. For example, the first junction magnetic layer 271 may comprise Co, Fe, and/or Ni. The first junction magnetic layer 271 may further comprise non-magnetic materials including B, Zn, Al, Ti, Ru, Ta, Si, Ag, Au, Cu, C, and/or N. Specifically, the first junction magnetic layer 271 may comprise CoFe and/or NiFe, and may further include B.

A tunnel barrier layer 230 may be provided on the first junction magnetic layer 271. The tunnel barrier layer 230 may include a metallic element and a non-metallic element. The metallic element may be controlled for the content of isotope having a nuclear spin quantum number other than 0 to become lower than a natural state. In the metallic element, the content of isotope where the number of protons and the number of neutrons are even in the nucleus may be higher than a natural state. As an example, when the metallic element includes Mg, the content of isotope ($^{25}$Mg) of Mg may be lower than about 10 at. %. Thus, the spin relaxation of electrons passing through a magnetic memory device is moderated, and the on/off resistance ratio of a device can be improved. Accordingly, the tunneling magneto resistance (TMR) of the magnetic memory device can increase.

The non-metallic element may be controlled for the content of isotope having a nuclear spin quantum number other than 0 to become lower than a natural state. In the non-metallic element, the content of isotope where the number of protons and the number of neutrons are even in the nucleus may be higher than a natural state. As an example, when the non-metallic element includes O, the content of isotope ($^{17}$O) of O may be lower than about 0.04 at. %.

A second junction magnetic layer 272 may be provided on the tunnel barrier layer 230. The second junction magnetic layer 272 may include a soft magnetic material. The second junction magnetic layer 272 may include the same material as that of the first junction magnetic layer 271. The content of materials in the second junction magnetic layer 272 may differ from the content of materials in the first junction magnetic layer 271. The magnetization direction of the first magnetic conductive layer 221 and the magnetization direction of the second junction magnetic layer 272 may have an arbitrary angle with respect to the planar surface of the substrate 200. For example, the magnetization direction of the first magnetic conductive layer 221 and the magnetization direction of the second junction magnetic layer 272 may have magnetization directions substantially vertical to the planar surface of the substrate 200 when a current flows in the direction vertical to the surfaces of the substrate 200.

The tunnel barrier layer 230, the first junction magnetic layer 271, and the second junction magnetic layer 272 may have the same crystal structure. Therefore, the magnetic resistance ratio of magnetic tunnel junction can be improved.

A second magnetic conductive layer 240 may be provided on the second junction magnetic layer 272. The second magnetic conductive layer 240 may include a ferromagnetic material. As an example, the second magnetic conductive layer 240 may include iron (Fe), cobalt (Co), nickel (Ni), chromium (Cr), Pt, palladium (Pd), iridium (Ir), ruthenium (Ru), rhodium (Rh), osmium (Os), rhenium (Re), gold (Au), and/or copper (Cu).

At least one of the first magnetic conductive layer 221, the second magnetic conductive layer 240, the first junction magnetic layer 271, and the second junction magnetic layer 272 may include an element where the content of isotope having a nuclear spin quantum number other than 0 is lower than a natural state. For example, the first magnetic conductive layer 221 may include Fe. Fe includes about 2.2 at. % $^{57}$Fe having a nuclear spin quantum number other than 0 in the natural state. Accordingly, by controlling the content of the isotope ($^{57}$Fe) lower than the natural state, spin relaxation can be more moderated.

An upper electrode layer 250 may be provided on the second magnetic conductive layer 240. The upper electrode layer 250 may be formed of the same material as that of the lower electrode layer 210.

According to another embodiment of the inventive concept, the contents of isotopes having nuclear spin quantum number other than 0 can become lower than a natural state. Accordingly, spin relaxation can be improved.

The magnetic memory devices according to embodiments of the inventive concept may be implemented as various types of semiconductor packages. For example, semiconductor memory devices according to embodiments of the inventive concept may be packaged in a package type, such as Package on Package (PoP), Ball Grid Arrays (BGAs), Chip Scale Packages (CSPs), Plastic Leaded Chip Carrier (PLCC), Plastic Dual In-Line Package (PDIP), Die In Waffle Pack (DIWP), Die In Wafer Form (DIWF), Chip On Board (COB), Ceramic Dual In-Line Package (CERDIP), Plastic Metric Quad Flat Pack (MQFP), Thin Quad Flat Pack (TQFP), Small Outline Package (SOP), Shrink Small Outline Package (SSOP), Thin Small Outline Package (TSOP), Thin Quad Flat Pack (TQFP), System In Package (SIP), Multi Chip Package (MCP), Wafer Level Stack Package (WLSP), Die In Wafer Form (DIWF), Die On Waffle Package (DOWP), Wafer-level Fabricated Package (WFP), and/or Wafer-Level Processed Stack Package (WSP). A package mounting the semiconductor memory device according to embodiments of the inventive concept may further include a controller and/or a logic device for controlling the semiconductor memory device.

Figure 4:
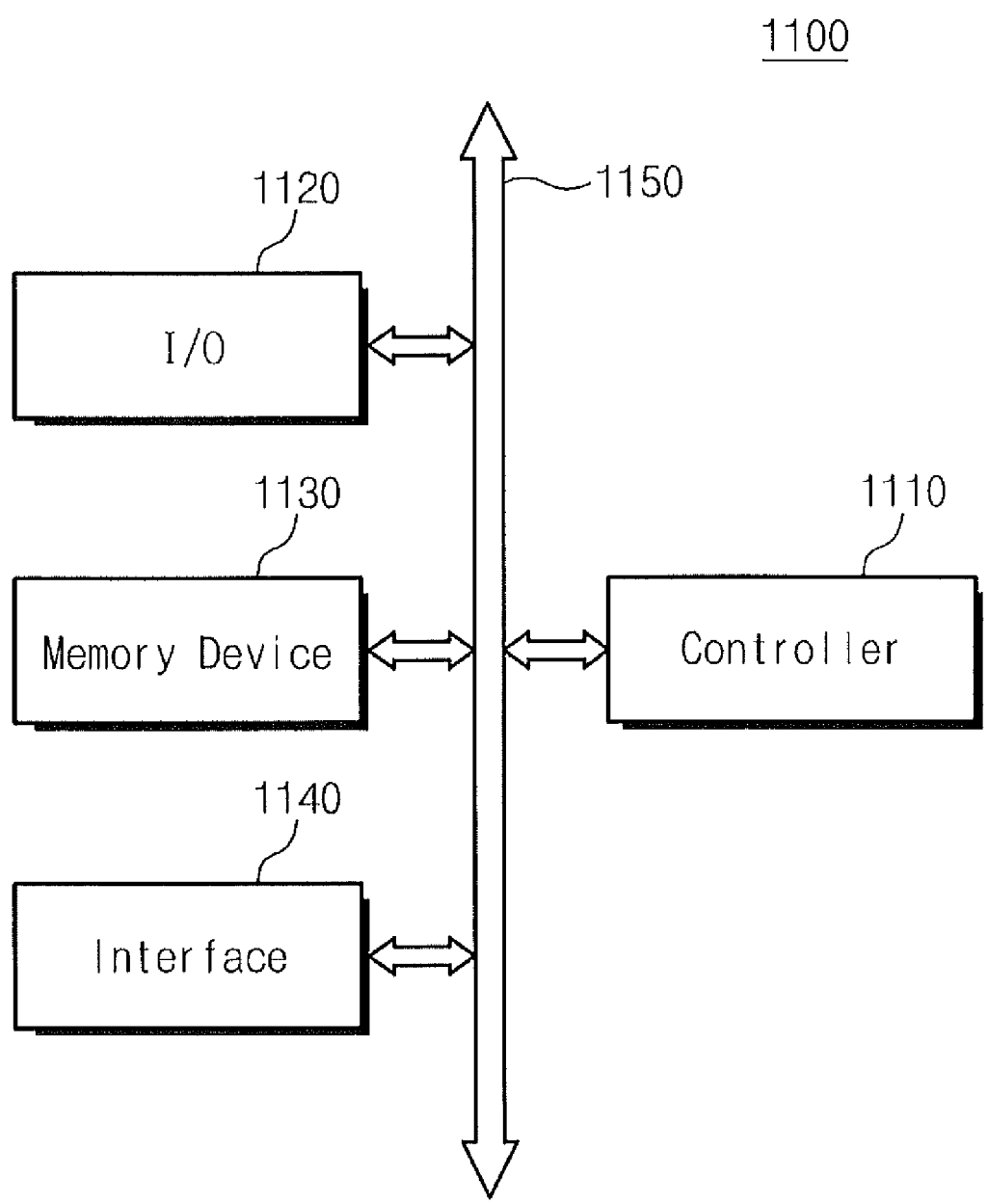
FIG. 4 is a block diagram illustrating an electronic system, which includes semiconductor memory devices according to embodiments of the inventive concept.

FIG. 4 is a block diagram illustrating an electronic system, which includes a semiconductor memory device according to embodiments of the inventive concept.

Referring to FIG. 4, an electronic system 1100 according to an embodiment of the inventive concept may include a controller 1110, an input/output (I/O) device 1120, a memory device 1130, an interface 1140, and a bus 1150. The controller 1110, the input/output device 1120, the memory device 1130, and/or the interface 1140 may be connected through the bus 1150. The bus 1150 corresponds to a path for the moving of data and/or control signals.

The controller 1110 may include a microprocessor, a digital signal processor, a microcontroller, and/or logic devices capable of performing a function similar to their function. The input/output device 1120 may include a keypad, a keyboard, and/or a display device. The memory device 1130 may store data and/or commands. The memory device may include at least one of the semiconductor memory devices according to embodiments of the inventive concept described above. Also, the memory device 1130 may further include another type of semiconductor memory device (for example, flash memory device, DRAM and/or SRAM). The interface 1140 may transmit data to a communication network or receive data from the communication network. The interface 1140 may support wired and/or wireless communication. For example, the interface 1140 may include an antenna and/or a wired/wireless transceiver. Although not shown, the electronic system 1100 is a working memory for improving the operation of the controller 1110 and may further include a high-speed DRAM and/or SRAM.

The electronic system 1100 may be used in, for example, Personal Digital Assistants (PDAs), portable computers, web tablets, wireless phones, mobile phones, digital music players, memory cards, and all electronic products enabling the transmission and/or reception of information in a wireless environment.

Figure 5:
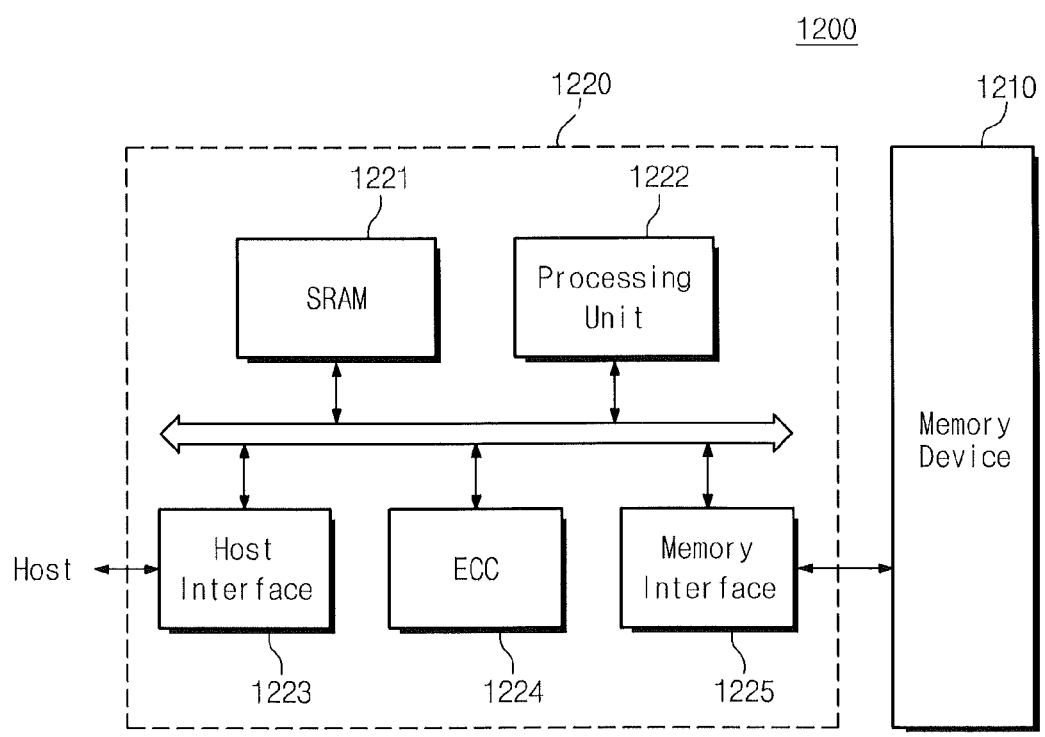
FIG. 5 is a block diagram illustrating a memory card, which includes magnetic memory devices according to embodiments of the inventive concept.

FIG. 5 is a block diagram illustrating a memory card, which includes a magnetic memory device according to embodiments of the inventive concept.

Referring to FIG. 5, a memory card 1200, according to an embodiment of the inventive concept, includes a memory device 1210. The memory device 1210 may include at least one of the semiconductor memory devices according to embodiments of the inventive concept described above. Also, the memory device 1210 may further include another type of semiconductor memory device (for example, flash memory device, DRAM and/or SRAM). The memory card 1200 may include a memory controller 1220 for controlling data exchange between a host and the memory device 1210.

The memory controller 1220 may include a processing unit 1222 for controlling the overall operation of the memory card 1200. Also, the memory controller 1220 may include an SRAM 1221 that is used as a working memory of the processing unit 1222. In addition, the memory controller 1220 may further include a host interface 1223, and a memory interface 1225. The host interface 1223 may perform a data exchange protocol between the memory card 1200 and the host. The memory interface 1225 may interface the memory controller 1220 and the memory device 1210. Furthermore, the memory controller 1220 may further include an error correction block (ECC) 1224. The error correction block 1224 may detect and correct errors in data that are read from the memory device 1210. Although not shown, the memory card 1200 may further include a ROM device storing code data for interfacing with the host. The memory card 1200 may be used as a portable data storage card. In some embodiments, the memory card 1200 may be implemented as a Solid State Disk (SSD) for replacing the hard disk of a computer system.

According to exemplary embodiments of the inventive concept, by decreasing the content of isotopes having a nuclear spin quantum number other than 0 in a magnetic memory device, spin relaxation can be prevented, and the on/off resistance ratio can increase.

The above-disclosed subject matter is to be considered illustrative and not restrictive, and the appended claims are intended to cover all such modifications, enhancements, and other embodiments, which fall within the true spirit and scope of the inventive concept. Thus, to the maximum extent allowed by law, the scope of the inventive concept is to be determined by the broadest permissible interpretation of the following claims and their equivalents, and shall not be restricted or limited by the foregoing detailed description.

That which is claimed:

1. A magnetic memory device comprising:
    a first magnetic conductive layer on a substrate;
    a first tunnel barrier layer on the first magnetic conductive layer, and comprising a first metallic element and a first non-metallic element; and
    a second magnetic conductive layer on the first tunnel barrier layer,
    wherein a content of an isotope of the first metallic element having a non-zero nuclear spin quantum number is lower than a natural state.

2. The magnetic memory device of claim 1, wherein the first metallic element comprises magnesium (Mg), titanium (Ti), aluminum (Al), and/or vanadium (V).

3. The magnetic memory device of claim 2, wherein:
    the first metallic element comprises magnesium (Mg), and
    a content of isotope ($^{25}$Mg) of the magnesium is lower than about 10 at. %.

4. The magnetic memory device of claim 1, wherein a content of an isotope of the first non-metallic element having a non-zero nuclear spin quantum number is lower than the natural state.

5. The magnetic memory device of claim 4, wherein the first non-metallic element comprises oxygen (O), nitrogen (N), and/or carbon (C).

6. The magnetic memory device of claim 5, wherein:
    the first non-metallic element comprises oxygen, and
    a content of isotope ($^{17}$O) of the oxygen is lower than about 0.04 at. %.

7. The magnetic memory device of claim 1, wherein a content of an isotope comprised in the first magnetic conductive layer having a non-zero nuclear spin quantum number is lower than the natural state.

8. The magnetic memory device of claim 1, wherein a content of an isotope comprised in the second magnetic conductive layer having a non-zero nuclear spin quantum number is lower than the natural state.

9. The magnetic memory device of claim 1, wherein a magnetization direction of the first magnetic conductive layer and a magnetization direction of the second magnetic conductive layer are substantially parallel to a planar surface of the substrate during operation of the magnetic memory device.

10. The magnetic memory device of claim 9, wherein the first magnetic conductive layer comprises a pinning layer and a pinned layer.

11. The magnetic memory device of claim 1, further comprising a second tunnel barrier layer and a third magnetic conductive layer, which are sequentially stacked on the second magnetic conductive layer.

12. The magnetic memory device of claim 11, wherein the second tunnel barrier layer comprises a second metallic element and a second non-metallic element,
    wherein a content of an isotope of the second metallic element having a non-zero nuclear spin quantum number is lower than the natural state.

13. The magnetic memory device of claim 12, wherein:
    the second metallic element comprises magnesium (Mg), and
    a content of isotope ($^{25}$Mg) of the magnesium is lower than about 10 at. %.

14. The magnetic memory device of claim 1, wherein a magnetization direction of the first magnetic conductive layer and a magnetization direction of the second magnetic conductive layer are substantially vertical to a planar surface of the substrate during operation of the magnetic memory device.

15. The magnetic memory device of claim 14, further comprising:
    a first junction magnetic layer between the first magnetic conductive layer and the first tunnel barrier layer; and
    a second junction magnetic layer between the second magnetic conductive layer and the first tunnel barrier layer.

16. The magnetic memory device of claim 1, wherein the first tunnel barrier layer is crystalline.

17. The magnetic memory device of claim 1, wherein a content of an isotope of the first metallic element having even numbers of both protons and neutrons is higher than the natural state.

* * * * *